United States Patent
Chang

(10) Patent No.: US 7,847,571 B2
(45) Date of Patent: Dec. 7, 2010

(54) SEMICONDUCTOR TEST SYSTEM WITH SELF-INSPECTION OF ELECTRICAL CHANNEL FOR POGO TOWER

(75) Inventor: Chung Lung Chang, Hsinchu (TW)

(73) Assignee: King Yuan Electronics Co., Ltd., Hsinchu (TW)

( * ) Notice: Subject to any disclaimer, the term of this patent is extended or adjusted under 35 U.S.C. 154(b) by 24 days.

(21) Appl. No.: 12/458,439

(22) Filed: Jul. 13, 2009

(65) Prior Publication Data

US 2010/0201392 A1  Aug. 12, 2010

(30) Foreign Application Priority Data

Feb. 11, 2009  (TW) ............................... 98104303 A

(51) Int. Cl.
*G01R 31/02*  (2006.01)
(52) U.S. Cl. ....................................... 324/761; 324/754
(58) Field of Classification Search ............... 324/158.1, 324/522, 760–765, 769; 438/14–18; 365/185.09, 365/185.33, 200–201
See application file for complete search history.

(56) References Cited

U.S. PATENT DOCUMENTS 5,771,191 A * 6/1998  Matsue ................... 365/185.09
7,057,410 B1 * 6/2006  Wohlfarth et al. ........... 324/765

* cited by examiner

*Primary Examiner*—Minh N Tang
*Assistant Examiner*—Trung Q Nguyen
(74) *Attorney, Agent, or Firm*—Bacon & Thomas, PLLC

(57) ABSTRACT

A semiconductor test system with self-inspection of an electrical channel for a Pogo tower is disclosed, which provides a short board and closed loops are formed respectively by providing various kinds of contacts to correspondingly electrically contact various kinds of Pogo pins in the Pogo tower on a load board. A self-inspection controller outputs different inspection signals, through the above-mentioned closed loops, respectively to each power channel, each I/O channel and each drive channel, and a plurality of parameter detection units detect response signals, and the response signals are judged by the self-inspection controller. Based on it, before inspecting a wafer to be tested, the invention is capable of self-inspecting each electrical channel and each Pogo pin on the Pogo tower to see if they are respectively in a normal condition, either in an open or short circuit, or if there exists a leakage condition.

10 Claims, 7 Drawing Sheets

SEMICONDUCTOR TEST SYSTEM WITH SELF-INSPECTION OF ELECTRICAL CHANNEL FOR POGO TOWER

BACKGROUND OF THE INVENTION

1. Field of the Invention

The present invention relates to a semiconductor test system with self-inspection of an electrical channel for a Pogo tower and, more particularly, to a test system for use in a test equipment for IC package.

2. Background of the Invention

In the industry of semiconductor package test, the test bench (machine) for testing dominates an absolutely important role. If the test bench or equipment is in failure or out of order, big loss in cost will be incurred. In addition, in many occasions of incurring failure or an abnormal condition, the bench or equipment itself will not inform or notify the situation and it is hard to trace back when the failure or abnormal condition starts, which quite often results in a serious event of taking back. Not only loss of cost is generated, but also reputation of the company will be affected.

Pogo pins are used to directly contact a chip or wafer to be tested for testing. As the Pogo pins obtain test parameters and send them back through electrical channels on a load board, due to that the Pogo pins on the Pogo tower or the electrical channels are up to many hundreds, inspection of electrical properties thereof indeed meets with problem. Further, since the Pogo pins and the electrical channels play a rather important role, once one inside them is damaged or in an abnormal condition, such as in an unexpected open circuit or short circuit, or in leakage, the whole test quality or test result will be affected.

Although each of the global enterprises in semiconductor test equipments possesses its own techniques of self-inspection for the test bench, the techniques are directed to inspecting the whole equipment, including inspections one by one on each part of the bench and each of the sub-systems. Such inspections waste much time and human labors. As far as the existing techniques are concerned, there is no provision of a system or method of inspecting an electrical channel for a Pogo tower capable of rapid and effective inspection and adaptively for use in all kinds of equipments produced by the enterprises.

Therefore, it is desirable to provide an improved semiconductor test system with self-inspection of an electrical channel for a Pogo tower to mitigate and/or obviate the aforementioned problems.

SUMMARY OF THE INVENTION

An object of the present invention is to provide a semiconductor test system with self-inspection of an electrical channel for a Pogo tower, comprising a tester head, a short board, a plurality of parameter detection units and a self-inspection controller. The tester head includes a load board and a Pogo tower, in which the load board contains a plurality of power channels, a plurality of I/O channels and a plurality of drive channels. The Pogo tower is installed on the load board and includes a plurality of power pins, a plurality of I/O pins and a plurality of drive pins, in which the plurality of power pins are respectively connected to the plurality of power channels, the plurality of I/O pins are respectively connected to the plurality of I/O channels, and the plurality of drive pins are respectively connected to the plurality of drive channels.

Further, the short board is provided with a plurality of power contacts, a plurality of I/O contacts, a plurality of drive contacts and a plurality of grounding terminals. Among which, the plurality of power pins on the Pogo tower respectively and correspondingly contact the plurality of power contacts electrically, the plurality of power contacts are respectively connected with the plurality of grounding terminals electrically via a plurality of resistive elements, and the plurality of I/O pins are respectively and correspondingly contact the plurality of I/O contacts electrically. A transmission wire is connected between each two I/O contacts in a two-by-two electrically connecting manner. Further, the plurality of drive pins are respectively and correspondingly contact the plurality of drive contacts electrically, and a drive wire is connected between each two drive contacts in a two-by-two electrically connecting manner.

In addition, the plurality of parameter detection units are respectively electrically connected to the plurality of power channels, the plurality of I/O channels and the plurality of drive channels in the load board. The self-inspection controller is electrically connected respectively to the plurality of power channels, the plurality of I/O channels, the plurality of drive channels in the load board, and to the plurality of parameter detection units. The self-inspection controller controls inputting different inspection signals respectively to each of the plurality of power channels, each of the plurality of I/O channels and each of the plurality of drive channels, and the plurality of parameter detection units detect response signals respectively produced by each of the plurality of power channels, each of the plurality of I/O channels and each of the plurality of drive channels in response to the inspection signals respectively received thereby and output the same to the self-inspection controller. Thus, before inspecting a wafer to be tested, the invention is capable of self-inspecting each of the electrical channels and each of the Pogo pins for the Pogo tower if they are respectively in a normal condition, either in an open or short circuit, or if there exists a leakage condition.

Preferably, the invention further includes a memory, being electrically connected to the self-inspection controller and storing a set of qualified parameters, in which the self-inspection controller retrieves the response signals, compares them with the set of qualified parameters and outputs a corresponding alarm signal if the comparison shows not matching. Of course, if the comparison shows matching, a normal signal will be outputted. The alarm signal may be of voice, light or electricity, or may be a flag for a comparison result. Similarly, the self-inspection controller of the invention may retrieve the response signals and show them on a display, i.e. directly displaying the response signals without a determining procedure.

The invention further comprises an alarm, being electrically connected to the self-inspection controller, wherein the self-inspection controller outputs the corresponding alarm signal via the alarm. The alarm may be a display, buzzer, vibrator, or any other alarming device capable of generating voice, light or electricity. Thus, the invention is capable of providing functions of determining with self-inspection and outputting with notification.

Moreover, according to the invention, the set of qualified parameters includes a first range of qualified resistance and a second range of qualified resistance. The first range of qualified resistance corresponds to an allowable range for resistive elements and the second range of qualified resistance corresponds to an allowable range for system resistance of a semiconductor test system. The inspection signals include a first inspection voltage and a set of second inspection voltages. The self-inspection controller controls inputting the first inspection voltage to each of the plurality of power channels and the plurality of parameter detection units respectively measure a response current produced by each of the plurality of power channels in response to the first inspection voltage received thereby, which the response current is based for calculation to produce a first inspection resistance via the self-inspection controller. Further, the self-inspection controller compares the first inspection resistance with the first range of qualified resistance in the memory. In addition, the self-inspection controller controls inputting the set of second inspection voltages to the plurality of I/O channels and the plurality of drive channel, and the plurality of parameter detection units measure a response current respectively produced by each of the plurality of I/O channels and each of the plurality of drive channels in response to the set of the second inspection voltages received thereby, which the response current is based for calculation to produce a second inspection resistance via the self-inspection controller. Furthermore, the self-inspection controller compares the second inspection resistance with the second range of qualified resistance in the memory.

In the invention, the set of second inspection voltages further includes two different inspection voltages. The self-inspection controller controls inputting the two different inspection voltages respectively to two particular I/O channels, in which the two particular I/O channels are respectively electrically connected to two particular I/O pins, the two particular I/O pins referring to two I/O contacts corresponding to ones on the short board and being electrically connected with the transmission wire. Further, the plurality of parameter detection units measure a response current respectively produced by the two I/O channels in response to the two different inspection voltages received thereby, which the response current is based for calculation to produce a second inspection resistance via the self-inspection controller. Furthermore, the self-inspection controller compares the second inspection resistance with the second range of qualified resistance in the memory.

In addition, in the invention, the set of second inspection voltages further include two different inspection voltages. The self-inspection controller controls inputting the two different inspection voltages respectively to two particular drive channels, in which the two particular drive channels are respectively electrically connected to two particular drive pins, the two particular drive pins referring to two drive contacts corresponding to ones on the short board and being electrically connected with the drive wire. Further, the plurality of parameter detection units measure a response current respectively produced by the two particular drive channels in response to the two different inspection voltages received thereby, which the response current is based for calculation to produce a second inspection resistance via the self-inspection controller. The self-inspection controller compares the second inspection resistance with the second range of qualified resistance in the memory.

Meantime, the invention may further comprise a memory, being electrically connected to the self-inspection controller, in which the self-inspection controller retrieves the response signals and stores the response signals in the memory, so as to record the inspection result. Moreover, the invention further comprises a central server, being electrically connected to the self-inspection controller via a network. Similarly, the self-inspection controller retrieves the response signals and stores the response signals in a central server via the network. The central server is mainly used for recording and managing. As such, the invention may be expanded to one that using the central server to proceed with managing and recording for a plurality of benches (machines).

Other objects, advantages, and novel features of the invention will become more apparent from the following detailed description when taken in conjunction with the accompanying drawings.

DETAILED DESCRIPTION OF THE PREFERRED EMBODIMENT

Figure 1:
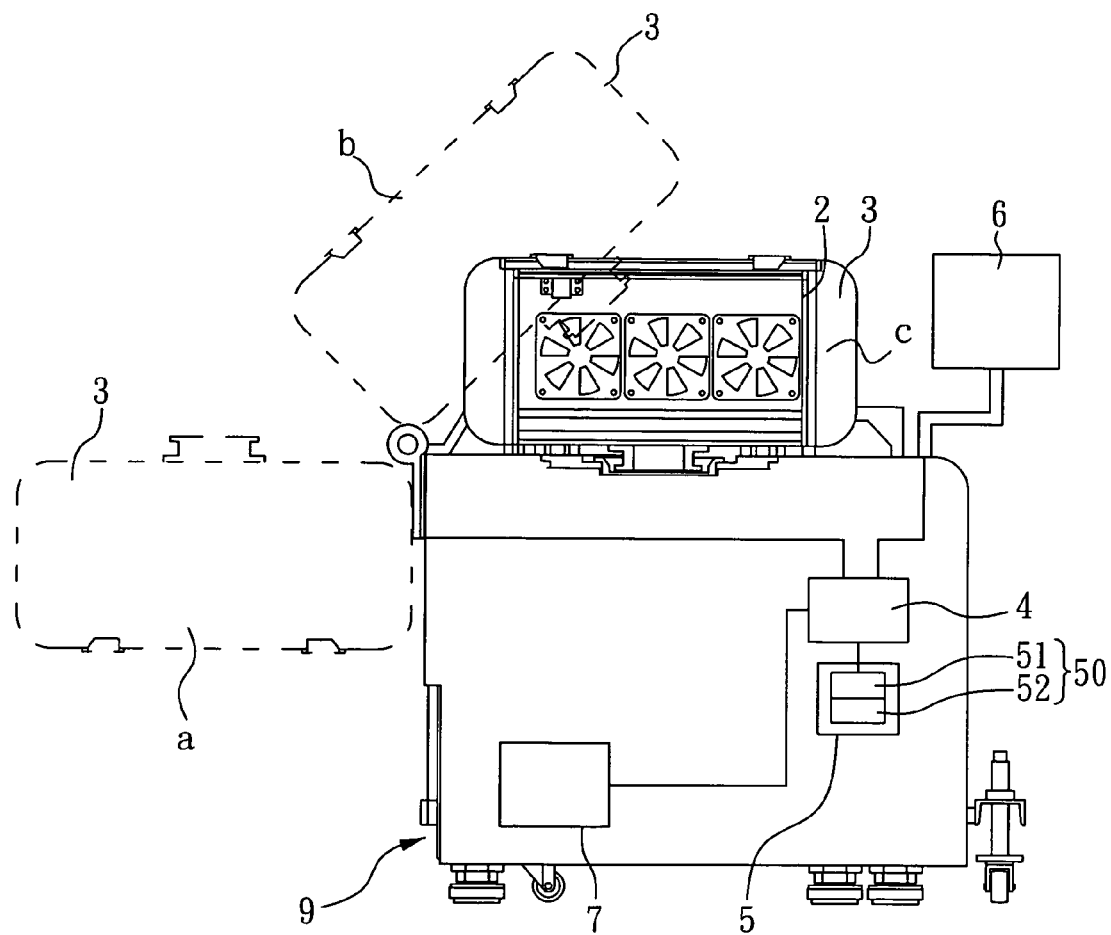
FIG. 1 is a schematic diagram showing a semiconductor test equipment as a whole according to a preferred embodiment of the invention.
Figure 2:
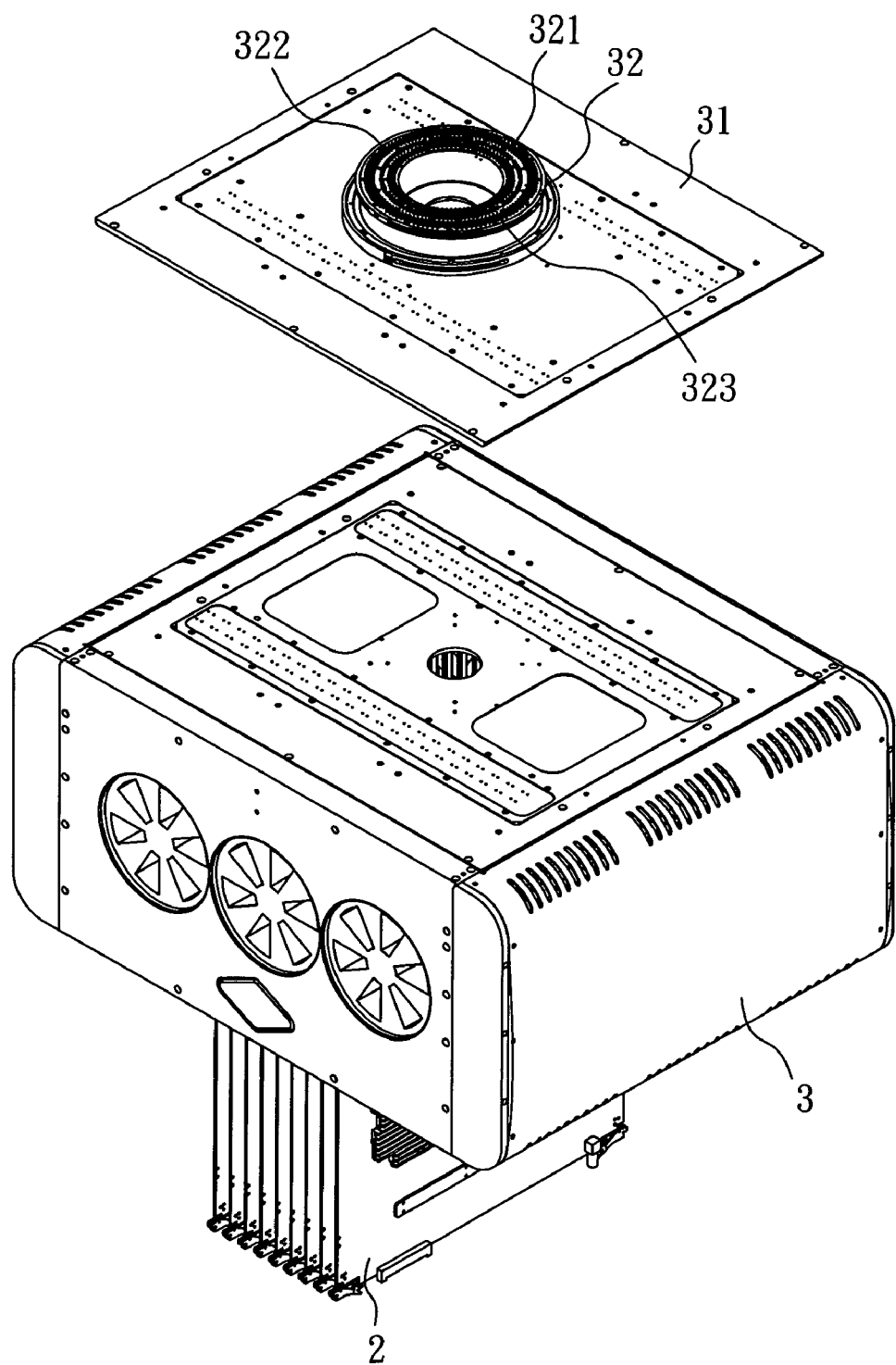
FIG. 2 is a perspective view showing a tester head, being located in position a, according to a preferred embodiment of the invention.
Figure 3:
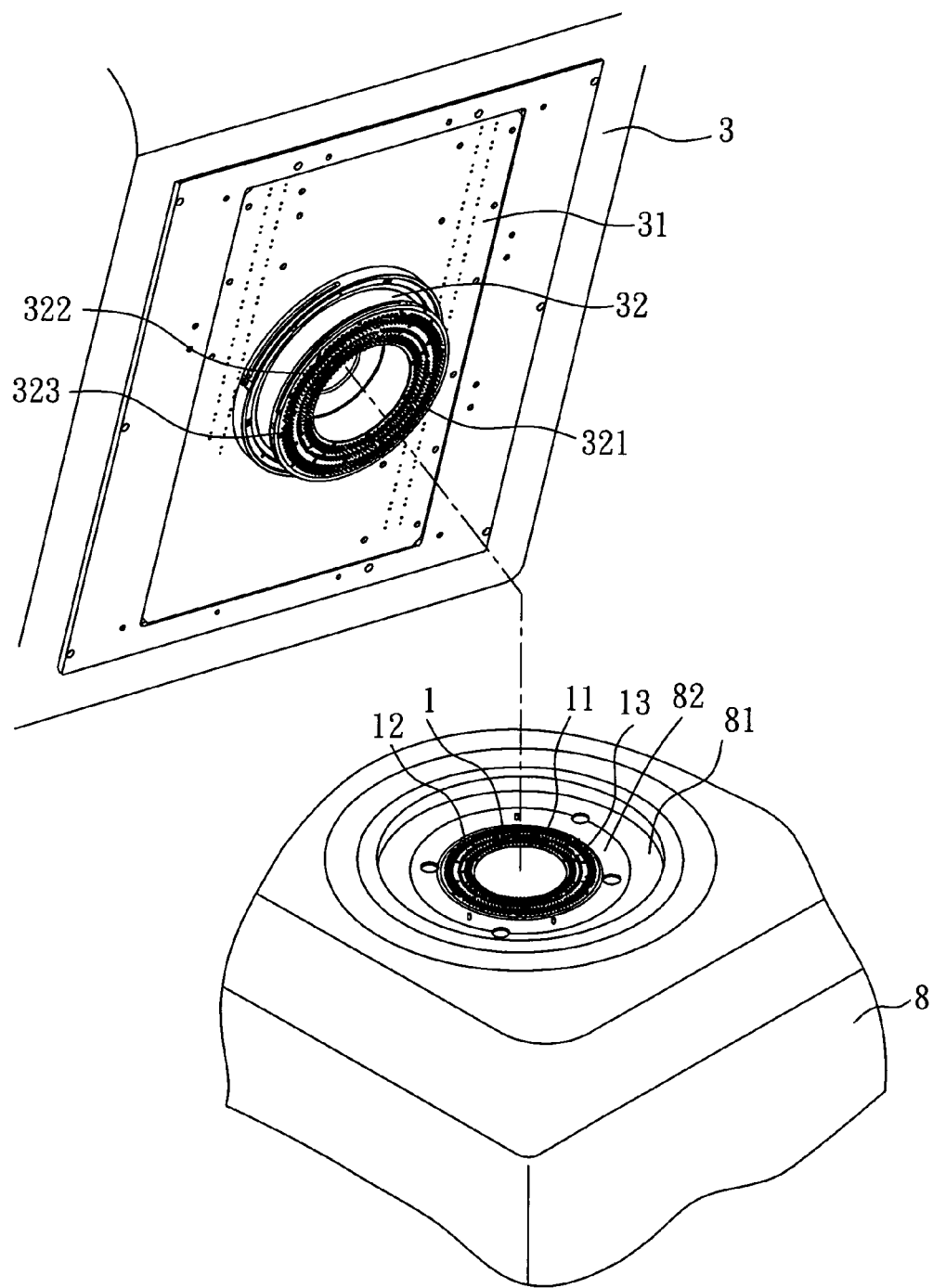
FIG. 3 is a three-dimensional diagram showing a base and a tester head, being located in position b, according to a preferred embodiment of the invention.

Please refer to FIGS. 1, 2 and 3 concurrently. FIG. 1 is a schematic diagram showing a semiconductor test equipment as a whole, provided with a semiconductor test system with self-inspection of an electrical channel for a Pogo tower, according to a preferred embodiment of the invention. FIG. 2 is a perspective view showing a tester head, being located in position a, according to a preferred embodiment of the invention. FIG. 3 is a three-dimensional diagram showing a tester head, being located in position b, and a base (chassis) according to a preferred embodiment of the invention. The figures show a test bench 9, on which is provided with a tester head 3. The tester head 3 includes a load board 31, a Pogo tower 32, and a plurality of pin electronics cards (PE cards) 2 inserted therein.

Figure 4:
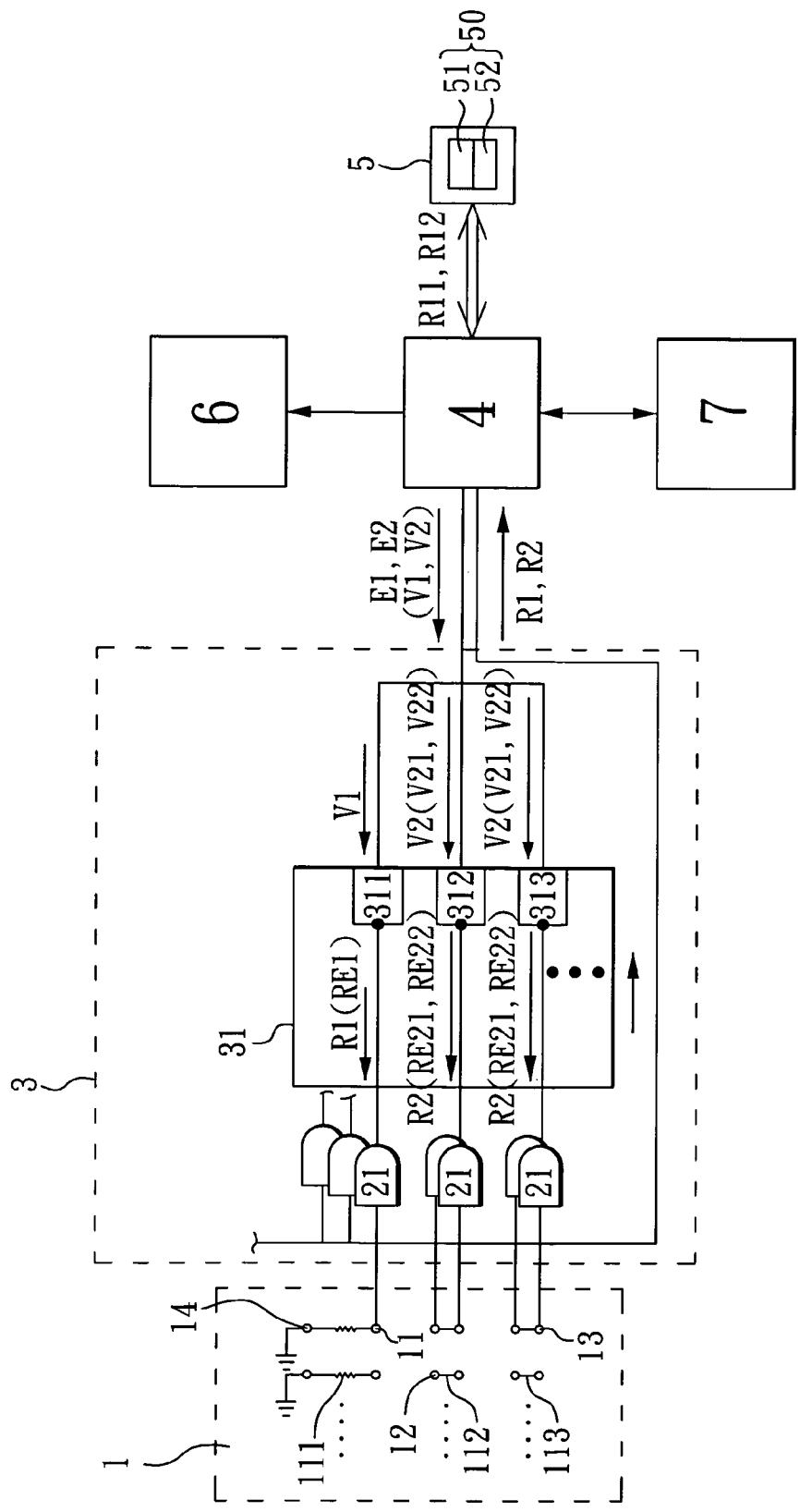
FIG. 4 shows a system structure according to a preferred embodiment of the invention.

Please refer to FIG. 4 at the same time. FIG. 4 shows a system structure of a semiconductor test system with self-inspection of an electrical channel for a Pogo tower according to a preferred embodiment of the invention. As shown, the load board 31 is electrically connected with a plurality of test circuit board 2 and contains a plurality of power channels 311, a plurality of I/O channels 312 and a plurality of drive channels 313. In addition, the Pogo tower 32 is installed on the load board 31 and contains a plurality of power pins 321, a plurality of I/O pins 322 and a plurality of drive pins 323. The above pins 321,322,323 respectively provide power required for test, data transmission and input of particular signals to drive a wafer to be tested, in which the plurality of power pins 321 are respectively electrically connected to the plurality of power channels 311, the plurality of I/O pins 322 are respectively electrically connected to the plurality of I/O channels 312 and the plurality of drive pins 323 are respectively electrically connected to the plurality of drive channels 313.

Figure 5A:
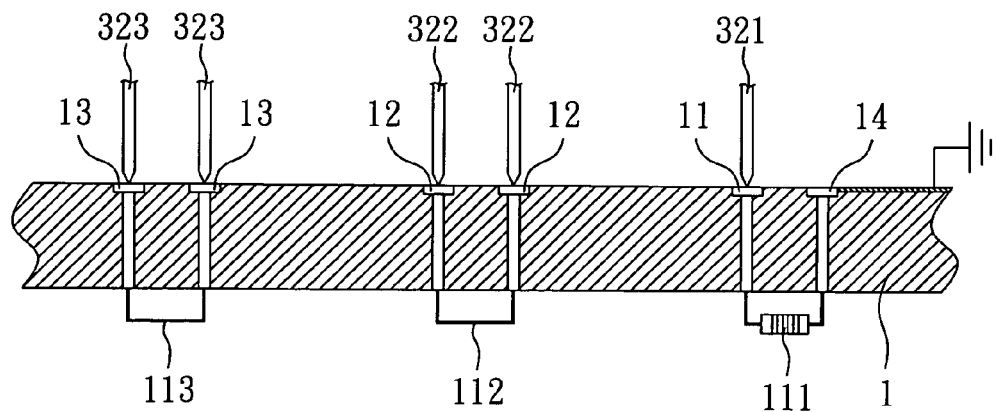
FIG. 5A is a cross-sectional schematic view for a short board according to a first preferred embodiment of the invention.

Please refer to FIG. 3 and FIG. 5A. FIG. 5A is a cross-sectional schematic view for a short board according to a first preferred embodiment of the invention. As shown, a base (chassis) 8 is provided, on which a carry platform 81 is installed. The carry platform 81 is concavely provided with a receiving trough 82. A short board 1 is placed in the receiving trough 82. The short board 1 is provided with a plurality of power contacts 11, a plurality of I/O contacts 12, a plurality of drive contacts 13 and a plurality of grounding terminals 14. As the system is in operation, the tester head 3 will move down for closing, and the plurality of power pins 321, the plurality of I/O pins 322 and the plurality of drive pins 323 on the Pogo tower 32 will contact the short board 1 for proceeding with test.

Inside it, the plurality of power pins 321 on the Pogo tower 32 respectively electrically contact the plurality of power contacts 11, and the plurality of power contacts 11 are respectively electrically connected to the plurality of grounding terminals 14 via a plurality of resistive elements 111, respectively. In this embodiment, each of the plurality of resistive elements 111 uses a resistor of 100 ohms. Further, the plurality of I/O pins 322 respectively electrically contact the plurality of the plurality of I/O contacts 12, and each two I/O contacts 12 are, via a transmission wire 112, electrically connected therebetween in a two-by-two manner. The plurality of drive pins 323 respectively electrically contact the plurality of the plurality of drive contacts 13, and each two drive contacts 13 are, via a drive wire 113, electrically connected therebetween in a two-by-two manner.

Figure 5B:
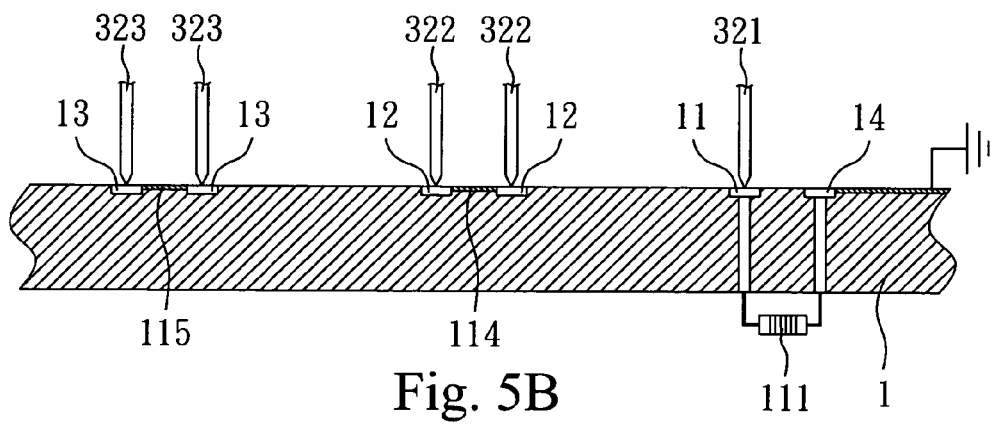
FIG. 5B is a cross-sectional schematic view for a short board according to a second preferred embodiment of the invention.
Figure 5C:
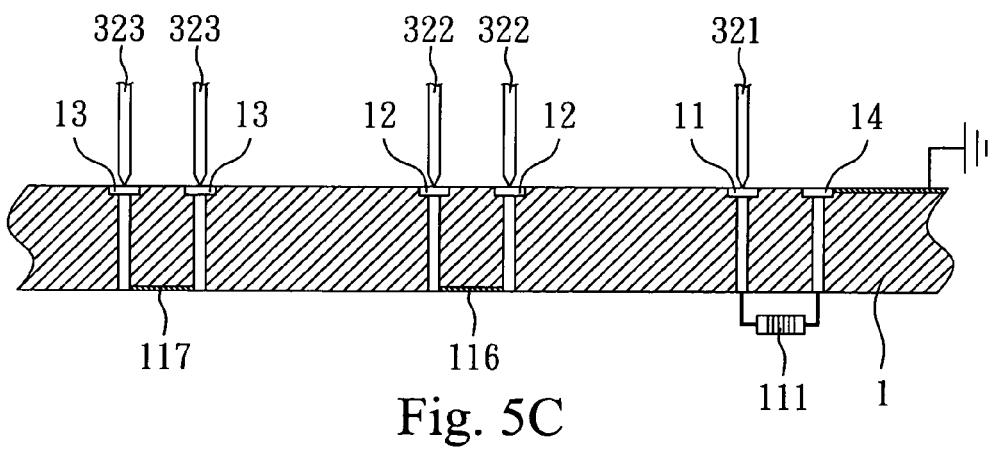
FIG. 5C is a cross-sectional schematic view for a short board according to a third preferred embodiment of the invention.

Please refer to FIG. 5B and FIG. 5C. FIG. 5B is a cross-sectional schematic view for a short board according to a second preferred embodiment of the invention. FIG. 5C shows a cross-sectional schematic view for a short board according to a third preferred embodiment of the invention. Among which, the transmission wire 112 and the drive wire 113 on the short board 1 may be respectively a transmission wire 114 and a drive wire 115 disposed in advance on an upper surface of the board when in printing, as shown in FIG. 5B. Similarly, the transmission wire 112 and the drive wire 113 on the short board 1 may be respectively a transmission wire 116 and a drive wire 117 disposed in advance on a lower surface of the board when in printing, as shown in FIG. 5C.

In addition, this embodiment includes a central server (not shown in the drawing), which is electrically connected with a plurality of test benches (not shown in the drawing) with different specifications via a network. The central server stores test programs corresponding to the plurality of test benches with different specifications and provides test results for recording and managing. As the test bench 9 is to proceed with self-inspection of an electrical channel, it only needs to input instructions (such as advan_t537x_rs_diagx) in any catalogs or a particular catalog. The test bench 9 will automatically download test programs from the central server to the particular catalog in the bench (such as /export/home/asx/diag/td_537x_rs_check) and automatically execute the same, while the result of execution will be stored in the bench and the central server at the same time so as to facilitate monitoring and managing.

Please continuously refer to FIG. 4. It shows that a plurality of parameter detection units 21 are provided in the tester head 3, and respectively electrically connected to a plurality of power channels 311, a plurality of I/O channels 312 and a plurality of drive channels 313 in the load board 31. In this embodiment, the plurality of parameter detection units 21 refer to a plurality of current detection units and are mainly for detecting current. In addition, the figure additionally shows a self-inspection controller 4, being electrically connected respectively to the plurality of power channels 311, the plurality of I/O channels 312 and the plurality of drive channels 313 in the load board 31, and to the plurality of parameter detection units 21. The self-inspection controller 4 controls inputting different inspection signals E1,E2 respectively to each of the plurality of power channels 311, each of the plurality of I/O channels 312 and each of the plurality of drive channels 313. The plurality of parameter detection units 21 detect response signals R1, R2 respectively produced by each of the plurality of power channels 311, each of the plurality of I/O channels 312 and each of the plurality of drive channels 313 in response to the inspection signals E1, E2 respectively received thereby and output the same.

Furthermore, a memory 5 stores a set of qualified parameters 50. The self-inspection controller 4 retrieves the response signals R1, R2, and compares them with the set of qualified parameters 50 and outputs a corresponding alarm signal if the comparison shows not matching. For example, since an alarm 6 in this embodiment is a display, labeling of the electrical channel shown on the display for not matching after comparison is "FAIL". If the comparison shows matching, a normal signal will be outputted and the labeling of the electrical channel shown on the display is "PASS". Of course, the alarm signal may be one of voice, light or electricity, such as generating voice, lighting or vibration, or may be a flag for the comparison result.

Figure 6:
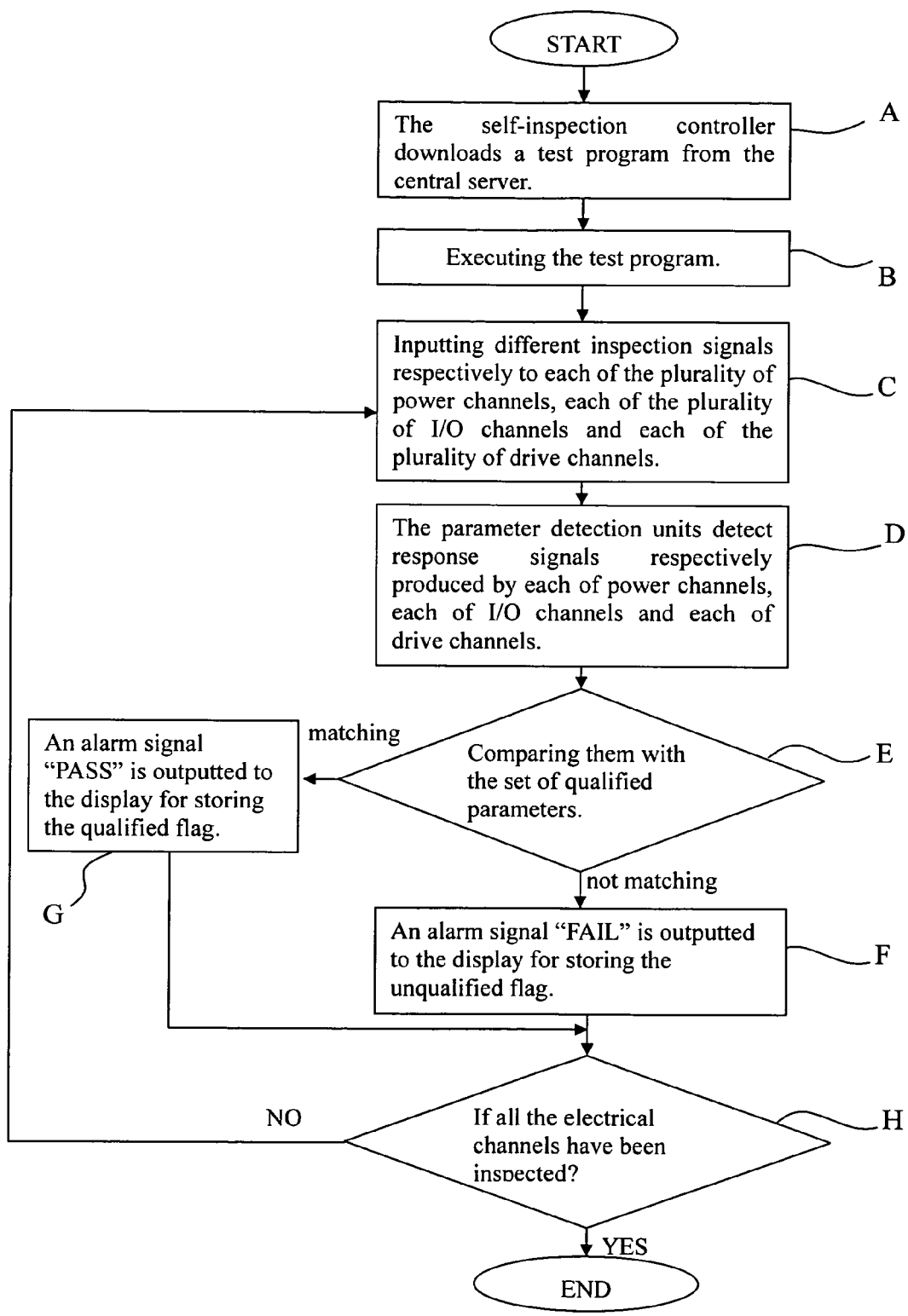
FIG. 6 shows an entire flow chart according to a preferred embodiment of the invention.

Please refer to FIG. 6. FIG. 6 shows an entire flow chart of a semiconductor test system with self-inspection of an electrical channel for a Pogo tower according to a preferred embodiment of the invention. The operations of the flow in this embodiment are as follows: Firstly, the self-inspection controller 4 downloads a test program from the central server (Step A) and automatically executes the test program (Step B). After execution, the self-inspection controller 4 controls inputting different inspection signals E1, E2 respectively to each of the plurality of power channels 311, each of the plurality of I/O channels 312 and each of the plurality of drive channels 313 (Step C). The plurality of parameter detection units 21 detect response signals R1, R2 respectively produced by each of the plurality of power channels 311, each of the plurality of I/O channels 312 and each of the plurality of drive channels 313 in response to the inspection signals E1, E2 respectively received thereby (Step D). After that, the self-inspection controller 4 retrieves the response signals R1, R2 and compares them with the set of qualified parameters 50 in the memory 5 (Step E). If the comparison shows not matching, an alarm signal "FAIL" is outputted to the display for storing the unqualified flag (Step F). If the comparison shows matching, an alarm signal "PASS" is outputted to the display for storing the qualified flag (Step G). At last, the self-inspection controller 4 determines if all the electrical channels have been inspected completely (Step H), if not, repeating the Step C, and if yes, ending the test program.

Figure 7:
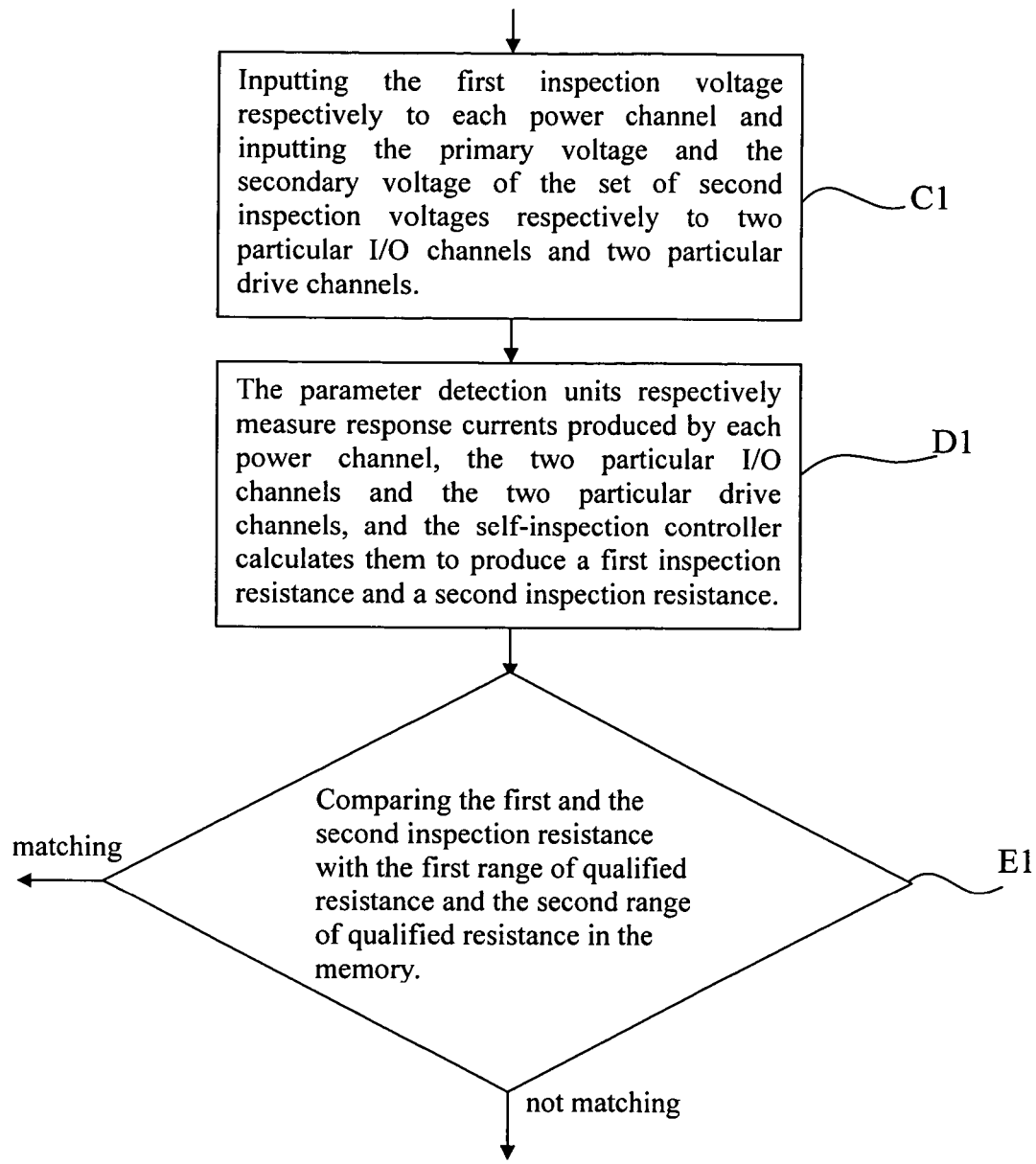
FIG. 7 shows a flow chart for detailed inspection according to a preferred embodiment of the invention.

Please refer to FIG. 4 together with FIG. 7. FIG. 7 shows a flow chart for detailed inspection of a semiconductor test system with self-inspection of an electrical channel for a Pogo tower according to a preferred embodiment of the invention. As shown, the set of qualified parameters 50 further includes a first range of qualified resistance 51 and a second range of qualified resistance 52. The first range of qualified resistance 51 corresponds to an allowable range for the resistive element 111 and the second range of qualified resistance 52 corresponds to an allowable range for system resistance of the semiconductor test system. The inspection signals E1, E2 respectively refer to a first inspection voltage V1 and a set of second inspection voltages V2. The set of second inspection voltages V2 further contains two different inspection voltages, i.e. a primary voltage V21 and a secondary voltage V22. Accordingly, the steps for inspection in this embodiment are detailed as follows. Firstly, the self-inspection controller 4 controls inputting the first inspection voltage V1 respectively to each of the plurality of power channels 311 and inputting the primary voltage V21 and the secondary voltage V22 of the set of second inspection voltages V2 respectively to two particular I/O channels 312 and two particular drive channels 313 (step C1).

The above-said two particular I/O channels 312 refer to a set of two I/O channels, being formed in a two-by-two manner in the plurality of I/O channel 312, and are respectively electrically connected to two particular I/O pins 322. The two particular I/O pins 322 refer to two I/O contacts 12 on the short board 1 and being electrically connected with the transmission wire 112. Similarly, the above-said two particular drive channels 313 refer to a set of two drive channels, being formed in a two-by-two manner in the plurality of drive channels 313, and are respectively electrically connected to two particular drive pins 323. The two particular drive pins 323 refer to two drive contacts 13 on the short board 1 and being electrically connected with the transmission wire 113. Then, the self-inspection controller 4 controls the plurality of parameter detection units 21 to respectively measure a response current RE1 produced by each of the plurality of power channels 311 in response to the first inspection voltage V1 received thereby, and controls the plurality of parameter detection units 21 to respectively measure response currents RE21, RE22 respectively produced by the above-said two particular I/O channels 312 and the above-said two particular drive channels 313 in response to the primary voltage V21 and the secondary voltage V22 received thereby.

Still further, in the self-inspection controller 4, the retrieved response currents RE1, RE21, RE22 are based for calculation to produce a first inspection resistance R11 and a second inspection resistance R12 (step D1). Lastly, the self-inspection controller 4 respectively compares the first inspection resistance R11 and the second inspection resistance R12, produced after calculation, with the first range of qualified resistance 51 and the second range of qualified resistance 52 in the memory 5 (step E1). Certainly, after comparison, the abnormal electrical channel and the normal electrical channel will be displayed in the display similarly, and then be recorded and stored.

In this embodiment, the first inspection voltage V1 inputted to each of the plurality of power channels 311 is 1V (volt). Since a power contact 11 is electrically connected to a grounding terminal 14 via a resistive element 111 of 100 ohms, the first range of qualified resistance 51 is set from 97 ohms to 103 ohms. Thus, if the first inspection resistance R11 produced after calculation is not within the range of 97 ohms to 103 ohms, it is judged as an abnormal condition. Based on this, it is primarily used to determine if each of the plurality of power channels 311 in the load board 31 and each of the plurality of power pins 321 on the Pogo tower 32 are in an unexpected open or short condition or in a leakage condition.

On the other hand, in this embodiment, the primary voltage V21 and the secondary voltage V22 of the set of second inspection voltages V2 are respectively 1V (volt) and 0 V (volt). Since the semiconductor test system itself has a system resistance of 50 ohms, the second range of qualified resistance 52 in this embodiment is set from 47 ohms to 53 ohms. Similarly, if the second inspection resistance R12 produced after calculation is not within the range of 47 ohms to 53 ohms, it is judged as an abnormal condition. Accordingly, it is primarily used to determine if each of the plurality of I/O channels 312 and each of the plurality of drive channels 313 in the load board 31, and each of the plurality of I/O pins 322 and each of the plurality of drive pins 323 on the Pogo tower 32 are in an unexpected open or short condition or in a leakage condition. Certainly, the invention may be utilized to selectively test a particular channel or all the channels, and may be modified to fully accord with different requirements.

Although the present invention has been explained in relation to its preferred embodiment, it is to be understood that many other possible modifications and variations can be made without departing from the scope of the invention as hereinafter claimed.

What is claimed is:

1. A semiconductor test system with self-inspection of an electrical channel for a Pogo tower, comprising:
    a tester head, including a load board and a Pogo tower, in which the load board contains a plurality of power channels, a plurality of I/O channels and a plurality of drive channels, and the Pogo tower is installed on the load board and contains a plurality of power pins, a plurality of I/O pins and a plurality of drive pins, the plurality of power pins being respectively connected to the plurality of power channels, the plurality of I/O pins being respectively connected to the plurality of I/O channels, and the plurality of drive pins being respectively connected to the plurality of drive channels;
    a short board, being provided with a plurality of power contacts, a plurality of I/O contacts, a plurality of drive contacts and a plurality of grounding terminals, in which the plurality of power pins on the Pogo tower respectively electrically contact the plurality of power contacts correspondingly, the plurality of power contacts are respectively electrically connected with the plurality of grounding points via a plurality of resistive elements, the plurality of I/O pins are respectively electrically contact the plurality of I/O contacts correspondingly, each two I/O contacts is electrically connected via a transmission wire therebetween, the plurality of drive pins are respectively electrically contact the plurality of drive contacts correspondingly, and each two drive contacts is electrically connected via a drive wire therebetween;
    a plurality of parameter detection units, being respectively electrically connected to the plurality of power channels, the plurality of I/O channels and the plurality of drive channels on the load board; and
    a self-inspection controller, being electrically connected respectively to the plurality of power channels, the plurality of I/O channels and the plurality of drive channels on the load board, and to the plurality of parameter detection units, in which the self-inspection controller controls inputting different inspection signals respectively to each of the plurality of power channels, each of the plurality of I/O channels and each of the plurality of drive channels, and the plurality of parameter detection units detect response signals respectively produced by each of the plurality of power channels, each of the plurality of I/O channels and each of the plurality of drive channels in response to the inspection signals respectively received thereby and output the same.

2. The semiconductor test system with self-inspection of an electrical channel for a Pogo tower as claimed in claim 1, further comprising a memory, being electrically connected to the self-inspection controller and storing a set of qualified parameters, in which the self-inspection controller retrieves the response signals, compares them with the set of qualified parameters and outputs a corresponding alarm signal if the comparison shows not matching.

3. The semiconductor test system with self-inspection of an electrical channel for a Pogo tower as claimed in claim 2, further comprising an alarm, being electrically connected to the self-inspection controller, wherein the self-inspection controller outputs the corresponding alarm signal via the alarm.

4. The semiconductor test system with self-inspection of an electrical channel for a Pogo tower as claimed in claim 3, wherein the alarm is a display.

5. The semiconductor test system with self-inspection of an electrical channel for a Pogo tower as claimed in claim 2, wherein the set of qualified parameters includes a first range of qualified resistance and a second range of qualified resistance, in which the first range of qualified resistance corresponds to an allowable range for the resistive element and the second range of qualified resistance corresponds to an allowable range for system resistance of the semiconductor test system, and the inspection signals include a first inspection voltage and a set of second inspection voltages, wherein the self-inspection controller controls inputting the first inspection voltage to each of the plurality of power channels, the plurality of parameter detection units respectively measure a response current produced by each of the plurality of power channels in response to the first inspection voltage received thereby, which response current is based for calculation to produce a first inspection resistance via the self-inspection controller, and the self-inspection controller compares the first inspection resistance with the first range of qualified resistance in the memory;

and wherein the self-inspection controller controls inputting the set of second inspection voltages to the plurality of I/O channels and the plurality of drive channel, the plurality of parameter detection units measure a response current respectively produced by each of the plurality of I/O channels and each of the plurality of drive channels in response to the set of the second inspection voltages received thereby, which response current is based for calculation to produce a second inspection resistance via the self-inspection controller, and the self-inspection controller compares the second inspection resistance with the second range of qualified resistance in the memory.

6. The semiconductor test system with self-inspection of an electrical channel for a Pogo tower as claimed in claim 5, wherein the set of second inspection voltages further include two different inspection voltages;

and wherein the self-inspection controller controls inputting the two different inspection voltages respectively to two particular I/O channels, in which the two particular I/O channels are respectively electrically connected to two particular I/O pins, the two particular I/O pins referring to two I/O contacts corresponding to ones on the short board and being electrically connected with the transmission wire, the plurality of parameter detection units measure a response current respectively produced by the two particular I/O channels in response to the two different inspection voltages received thereby, which response current is based for calculation to produce a second inspection resistance via the self-inspection controller, and the self-inspection controller compares the second inspection resistance with the second range of qualified resistance in the memory.

7. The semiconductor test system with self-inspection of an electrical channel for a Pogo tower as claimed in claim 5, wherein the set of second inspection voltages further include two different inspection voltages, and wherein the self-inspection controller controls inputting the two different inspection voltages respectively to two particular drive channels, in which the two particular drive channels are respectively electrically connected to two particular drive pins, the two particular drive pins referring to two drive contacts corresponding to ones on the short board and being electrically connected with the drive wire, the plurality of parameter detection units measure a response current respectively produced by the two particular drive channels in response to the two different inspection voltages received thereby, which response current is based for calculation to produce a second inspection resistance via the self-inspection controller, and the self-inspection controller compares the second inspection resistance with the second range of qualified resistance in the memory.

8. The semiconductor test system with self-inspection of an electrical channel for a Pogo tower as claimed in claim 1, further comprising a display, being electrically connected to the self-inspection controller, in which the self-inspection controller further retrieves the response signals and displays the response signals via the display.

9. The semiconductor test system with self-inspection of an electrical channel for a Pogo tower as claimed in claim 1, further comprising a memory, being electrically connected to the self-inspection controller, in which the self-inspection controller retrieves the response signals and stores the response signals in the memory.

10. The semiconductor test system with self-inspection of an electrical channel for a Pogo tower as claimed in claim 1, further comprising a central server, being electrically connected to the self-inspection controller via a network, in which the self-inspection controller further retrieves the response signals and stores the response signals in the central server via the network.

\* \* \* \* \*